United States Patent
Chae et al.

(10) Patent No.: US 6,936,884 B2
(45) Date of Patent: Aug. 30, 2005

(54) NONVOLATILE SILICON/OXIDE/NITRIDE/ SILICON/NITRIDE/OXIDE/SILICON MEMORY

(75) Inventors: Soo-doo Chae, Seoul (KR); Ju-hyung Kim, Yongin (KR); Chung-woo Kim, Seongnam (KR); Hee-soon Chae, Cheongju (KR); Won-il Ryu, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 136 days.

(21) Appl. No.: 10/682,984

(22) Filed: Oct. 14, 2003

(65) Prior Publication Data

US 2004/0079983 A1 Apr. 29, 2004

(30) Foreign Application Priority Data

Oct. 14, 2002 (KR) .............................. 10-2002-0062482

(51) Int. Cl.$^7$ ........................................... H01L 29/788
(52) U.S. Cl. ....................... 257/315; 257/316; 257/324; 257/411; 438/257; 438/260
(58) Field of Search ................................ 257/314, 315, 257/406, 411, 635, 640, 316, 324; 438/257–265

(56) References Cited

U.S. PATENT DOCUMENTS

2002/0063277 A1 * 5/2002 Ramsbey et al. ........... 257/316

OTHER PUBLICATIONS

Chan, et al., "A True Single–Transistor . . . " IEEE Electron Device Letters EDL–8(3):93–95 (Mar. 1987).

* cited by examiner

*Primary Examiner*—David Nelms
*Assistant Examiner*—Long Tran
(74) *Attorney, Agent, or Firm*—Lee & Morse, P.C.

(57) ABSTRACT

A nonvolatile silicon/oxide/nitride/silicon/nitride/oxide/ silicon (SONSNOS) structure memory device includes a first insulating layer and a second insulating layer stacked on a channel of a substrate, a first dielectric layer and a second dielectric layer formed on the first insulating layer and under the second insulating layer, respectively, and a group IV semiconductor layer, silicon quantum dots, or metal quantum dots interposed between the first dielectric layer and the second dielectric layer. The provided SONSNOS structure memory device improves a programming rate and the capacity of the memory.

32 Claims, 5 Drawing Sheets

NONVOLATILE SILICON/OXIDE/NITRIDE/SILICON/NITRIDE/OXIDE/SILICON MEMORY

BACKGROUND OF THE INVENTION

1. Field of the Invention

The present invention relates to a nonvolatile memory. More particularly, the present invention is directed to a silicon/oxide/nitride/silicon/nitride/oxide/silicon (SONSNOS) memory having an improved storage capacity.

2. Description of the Related Art

FIG. 1 illustrates a sectional view of a conventional flash electrically erasable programmable read only memory (EEPROM) cell. The flash EEPROM, as nonvolatile memory, stores data even in a power off state.

Referring to FIG. 1, a gate electrode 17 is located on a substrate 11 having a source electrode 13 and a drain electrode 15. A gate oxide 21, a floating gate 23, and an insulating layer 25 are sequentially stacked between the gate electrode 17 and the substrate 11.

In general, a flash memory is programmed using hot carriers that are injected from a portion of the substrate 11, in particular, the channel of electrons that is formed between the source electrode 13 and the drain electrode 15. A hot carrier injection mechanism includes converting the electrons flowing through the channel from the source to the drain into energetic electrons, which are then injected into the floating gate 23, under proper voltage conditions. The source electrode 13 and a corresponding portion of the substrate 11 are grounded. A relatively high positive voltage is applied to the gate electrode 17 in order to induce an electric field that attracts the electrons. In addition, a proper positive voltage is applied to the drain electrode 15 to generate hot carriers (electrons). The hot carriers are injected into the floating gate 23 by the electric field of the gate electrode 17. When a sufficient amount of negative charge is accumulated in the floating gate 23, the negative potential of the floating gate 23 is increased, causing the net gate voltage to go below the threshold voltage of a field effect transistor (FET), in order to obstruct the electrons from flowing through the channel. The amount of read current is used as a factor to determine whether the flash memory is programmed. The discharge of the floating gate is referred to as "erasing." Here, erasing is performed by a tunneling mechanism between the floating gate and the substrate. An erasing operation of data from a flash memory is performed by applying a high positive voltage to the source electrode and grounding the gate electrode and the substrate, while floating the drain electrode of a memory cell.

However, since a flash memory has a disadvantages of low retention, a silicon/oxide/nitride/oxide/silicon (SONOS) memory device may only be used for increasing information storage capacity and improving process performance.

FIG. 2 illustrates a sectional view of a conventional SONOS memory cell. Referring to FIG. 2, a gate electrode 37 is formed on a substrate 31 having a source electrode 33 and a drain electrode 35, and silicon oxide layers 41 and 45 as insulating layers are formed between the substrate 31 and the gate electrode 37. In addition, a non-conductive dielectric layer 43 for trapping electrons is interposed between the silicon oxide layers 41 and 45.

When a SONOS memory having two bits per cell is operated, two bits, i.e., a right bit and a left bit, of the SONOS memory cell use a conventional programming method using hot carriers (electrons); however, each bit reads data at a relatively low gate voltage in different directions. For example, the right bit of the SONOS memory is programmed by applying a programming voltage to the gate electrode or to the drain electrode, while grounding or applying a low voltage to the source electrode. Accordingly, hot carriers are sufficiently accelerated and injected into a region of the non-conductive dielectric layer near the drain electrode. However, the SONOS memory is read by applying a reading voltage to the gate electrode and the source electrode in an opposite direction while grounding or applying a low voltage to the drain electrode. Accordingly, the left bit is programmed and read by exchanging the voltages of the source electrode and the drain electrode. When one bit is programmed, the information in the other bit is maintained.

The SONOS memory reads data in a reverse direction using a relatively low level of gate voltage so that the drop of the potential across the channel is significantly reduced. Accordingly, the effects of the charges trapped in a local trapping region are increased to enable the programming of the SONOS memory at a high rate. In addition, the SONOS memory is able to improve the erasing mechanism by applying a proper erasing voltage to the gate electrode and the drain electrode of the right bit and the source electrode of the left bit. Furthermore, the SONOS memory can improve the lifespan of the device by preventing the SONOS memory from being worn down in a cycling operation.

However, regardless of the advantages of the SONOS memory, a memory that has a larger storage capacity than the conventional SONOS memory and that can be programmed at a higher rate than the conventional SONOS memory is required.

SUMMARY OF THE INVENTION

The present invention provides a memory device having a high programming operation rate and a high storage capacity using the advantages of a silicon/oxide/nitride/silicon/nitride/oxide/silicon (SONSNOS) memory structure.

According to an embodiment of the present invention, there is provided a silicon/oxide/nitride/silicon/nitride/oxide/silicon (SONSNOS) structure memory device having a semiconductor substrate including a source electrode and a drain electrode that are separated by a predetermined distance and a channel for moving electrons between the source and drain electrodes, and a gate electrode formed on the semiconductor substrate to control the input of the electrons from the channel into traps of the SONSNOS structure, the SONSNOS structure including a first insulating layer and a second insulating layer stacked on the channel of the substrate, a first dielectric layer and a second dielectric layer formed on the first insulating layer and under the second insulating layer, respectively, and a group IV semiconductor layer interposed between the first and the second dielectric layers.

According to another embodiment of the present invention, there is provided a SONSNOS structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure including a first insulating layer and a second insulating layer stacked on the channel of the substrate, a first dielectric layer and a second dielectric layer formed on the first insulating layer and under the second insulating layer, respectively, and nano quantum dots that are formed of a group IV semiconductor material interposed between the first and the second dielectric layers.

According to yet another embodiment of the present invention, there is provided a SONSNOS structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure including a first insulating layer and a second insulating layer stacked on the channel of the substrate, a first dielectric layer and a second dielectric layer formed on the first insulating layer and under the second insulating layer, respectively, and nano quantum dots that are formed of a metal and are interposed between the first and the second dielectric layers.

According to still another embodiment of the present invention, there is provided a multi-layered SONSNOS structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure including a first insulating layer and a second insulating layer stacked on the channel of the substrate, a plurality of dielectric layers formed on the first insulating layer and under the second insulating layer, and a plurality of group IV semiconductor layers, wherein one of the plurality of group IV semiconductor layers is interposed between adjacent dielectric layers.

According to an embodiment of the present invention, there is provided a multi-layered SONSNOS structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure including a first insulating layer and a second insulating layer stacked on the channel of the substrate, a plurality of dielectric layers formed on the first insulating layer and under the second insulating layer, and nano quantum dots formed of a group IV semiconductor material interposed between adjacent dielectric layers.

According to yet still another embodiment of the present invention, there is provided a multi-layered SONSNOS structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure including a first insulating layer and a second insulating layer stacked on the channel of the substrate, a plurality of dielectric layers formed on the first insulating layer and under the second insulating layer, and nano quantum dots formed of a metal interposed between adjacent dielectric layers.

According to a feature of the present invention, each of the first insulating layer and the second insulating layer of the above embodiments may be formed of a material selected from the group consisting of silicon oxide ($SiO_2$), aluminum oxide ($Al_2O_3$), tantalum oxide ($TaO_2$), and titanium oxide ($TiO_2$).

According to another feature of the present invention, each of the dielectric layers of the above embodiments may be formed of one of silicon nitride ($Si_3N_4$) and PZT.

According to yet another feature of the present invention, the group IV semiconductor material or layer of the above embodiments may be formed of one of silicon (Si) and germanium (Ge).

According to still another feature of the present invention, the nano quantum dots of the above embodiments may be formed by one of a low pressure chemical vapor deposition (LPCVD) method and a physical method. The physical method of the present invention may include a sputtering method, a vacuum synthesis method, a gas-phase synthesis method, a condensed phase synthesis method, a high deposition rate method using an ionized cluster beam, a consolidation method, a high-speed milling method, a mix-alloy processing method, a deposition method, or a sol-gel method.

According to a feature of the present invention, the nano quantum dots interposed between the dielectric layers may be made of gold (Au) or aluminum (Al).

The SONSNOS memory according to the present invention increases the number of trap sites for storing the electrons to improve the programming rate and the capacity of the memory.

BRIEF DESCRIPTION OF THE DRAWINGS

The above and other embodiments, features and advantages of the present invention will become more apparent to those of ordinary skill in the art by describing in detail preferred embodiments thereof with reference to the attached drawings in which.

DETAILED DESCRIPTION OF THE INVENTION

Figure 1:
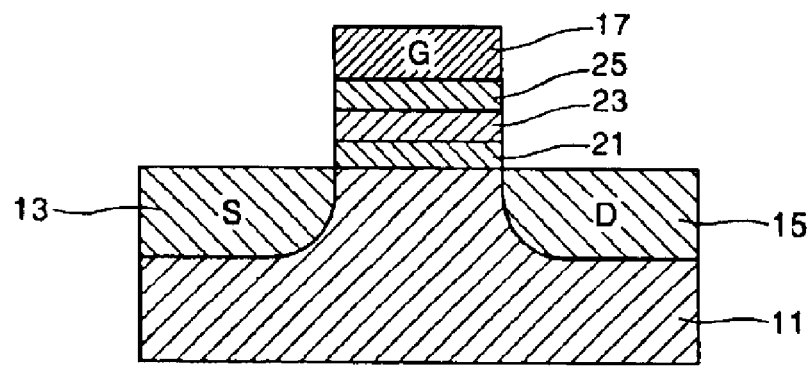
FIG. 1 illustrates a sectional view of a conventional flash memory cell.
Figure 2:
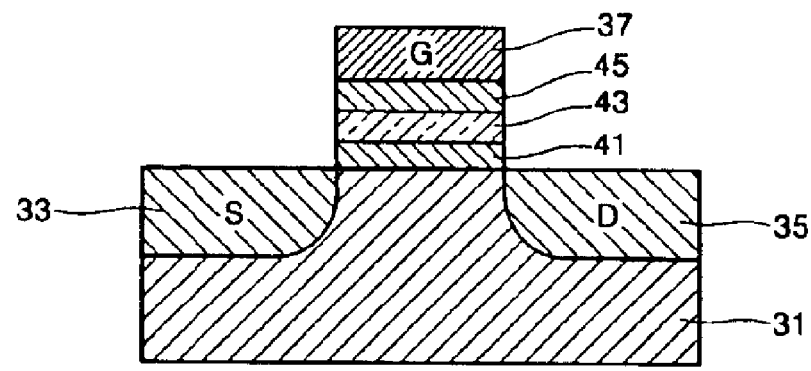
FIG. 2 illustrates a sectional view of a conventional SONOS memory cell.

Korean Patent Application No. 2002-62482, filed on Oct. 14, 2002, and entitled: "Nonvolatile Silicon/Oxide/Nitride/

Silicon/Nitride/Oxide/Silicon Memory," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout. In addition, the term "recording" is used to describe the process of inputting the information (that requires being stored) into the memory cell.

Figure 3:
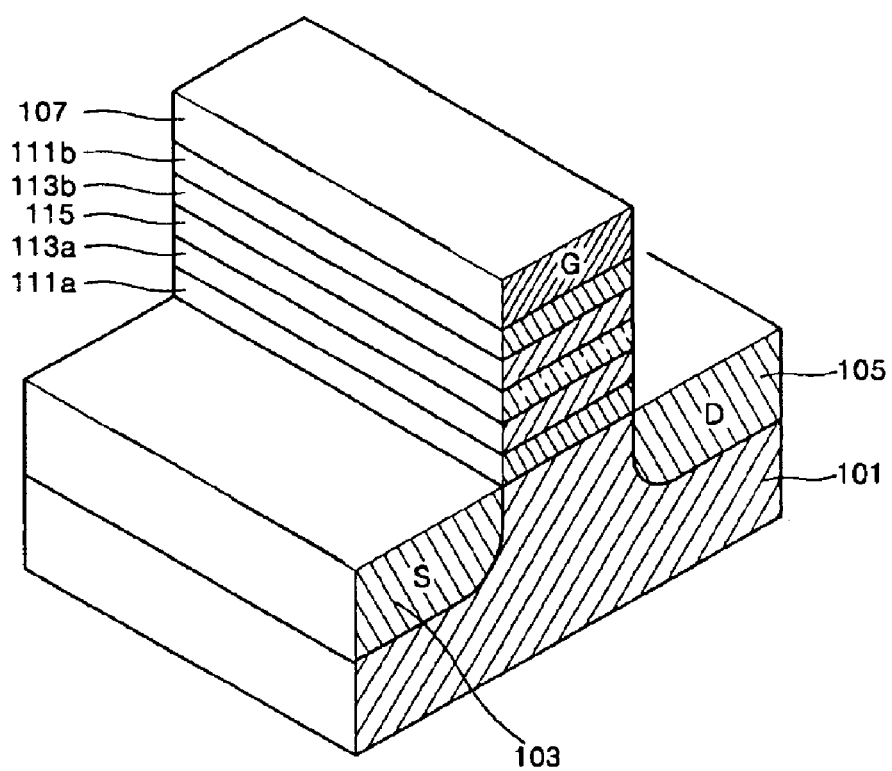
FIG. 3 illustrates a perspective view of a silicon/oxide/nitride/silicon/nitride/oxide/silicon (SONSNOS) memory cell according to a first embodiment of the present invention.

FIG. 3 illustrates a perspective view of silicon/oxide/nitride/silicon/nitride/oxide/silicon (SONSNOS) memory according to the first embodiment of the present invention.

Referring to FIG. 3, a gate electrode 107 is located on a substrate 101 having a source electrode 103 and a drain electrode 105, and a multi-layered ONSNO layer is interposed between the substrate 101 and the gate electrode 107 to trap electrons. An electron channel is formed between the source and drain electrodes 103 and 105. Here, the gate electrode 107 may be formed using a semiconductor, such as silicon (Si), or a metal.

The ONSNO layer includes first and second oxide layers 111a and 111b, respectively, located on the substrate 101 and under the gate electrode 107; first and second nitride layers 113a and 113b, respectively, located on the first oxide layer 111a and under the second oxide layer 111b; and a silicon layer 115 interposed between the first and second nitride layers 113a and 113b.

The first and second oxide layers 111a and 111b may be formed of an insulating material, such as silicon oxide ($SiO_2$), aluminum oxide ($Al_2O_3$), tantalum oxide ($TaO_2$), or titanium oxide ($TiO_2$), and the first and second nitride layers 113a and 113b may be formed of silicon nitride ($Si_3N_4$) or substituted by a metal, such as PZT, having a trap site to a trap concentration of greater than $10^{12}/cm^2$. In addition, the silicon layer 115 can be substituted by a germanium layer.

In order to fabricate the SONSNOS memory according to the first embodiment of the present invention, the channel region is formed by lightly implanting ions (not shown) into the substrate 101 and the ONSNO layer is formed on the channel region. Thereafter, a semiconductor or metal layer (for forming the gate electrode 107) is deposited on the ONSNO layer; the semiconductor or metal layer and the ONSNO layer are patterned by using a photolithography and an etching process to form the gate electrode 107 pattern above a ONSNO pattern. Ions are implanted using the gate electrode 107 as a mask to form the source and drain electrodes 103 and 105 so that the gate electrode 107 is completed.

In order to record information that requires being stored into the SONSNOS memory cell, a first positive voltage is applied to the drain electrode 105 while grounding the source electrode 103 or applying a low voltage to the source electrode 103, and a second positive voltage higher than the first positive voltage is applied to the gate electrode 107. In this case, an electron channel is formed from the source electrode 103 to the drain electrode 105, and the electrons moving from the source electrode 103 towards the drain electrode 105 which tunnel through the first oxide layer 111a due to the favorable electric field formed by the gate electrode 107 are trapped at the interface between the first nitride layer 113a and the silicon layer 115, the defects in the silicon layer 115, or at the interface between the silicon layer 115 and the second nitride layer 113b. According to the first embodiment of the present invention, since the SONSNOS memory cell has more trapping sites for electrons compared to the conventional SONOS memory cell, the SONSNOS memory can secure a larger memory capacity.

In order to read information from the memory, a third positive voltage that is lower than the first positive voltage is applied to the drain electrode 105, and the voltage of the gate electrode 107 is set at a fourth voltage that is lower than the third voltage. When a current greater than a reference current flows through between the source and the drain electrodes 103 and 105, data having a value '1' is assigned, and when a current lower than the reference current flows between the source and the drain electrodes 103 and 105, data having a value '0' is assigned, based on the polarity of the threshold voltage of the memory cell for reading the stored information.

In order to erase the memory cell, 0 V is applied to the gate electrode 107, a high voltage is applied to the source region 103, and the drain electrode 105 is opened. Accordingly, electrons are withdrawn through the source region 103 so that the information in the memory cell is erased.

Figure 4A:
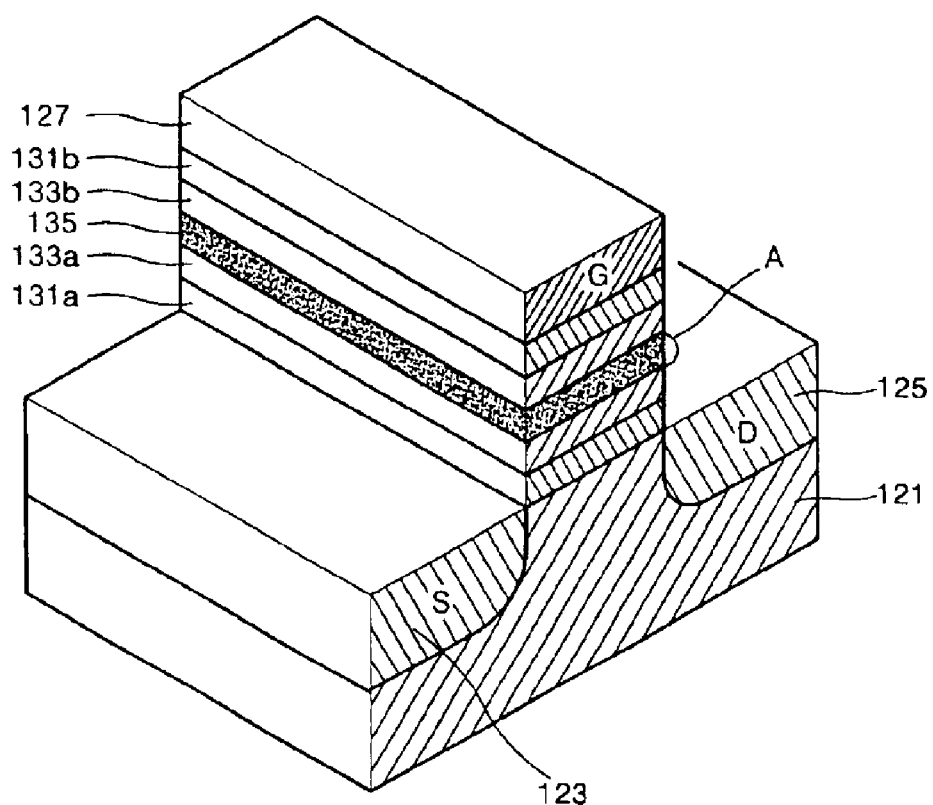
FIG. 4A illustrates a perspective view of a SONSNOS memory cell according to a second embodiment of the present invention.

FIG. 4A illustrates a perspective view of an SONSNOS memory cell according to the second embodiment of the present invention.

Reference numeral 121 denotes a substrate, 123 denotes a source electrode, 125 denotes a drain electrode, 127 denotes a gate electrode, 131a denotes a first oxide layer, 131b denotes a second oxide layer, 133a denotes a first nitride layer, 133b denotes a second nitride layer, and 135 denotes silicon quantum dots. The structure of the SONSNOS memory cell according to the second embodiment of the present invention is similar to the structure of the SONSNOS memory cell according to the first embodiment of the present invention, except for the inclusion of the silicon quantum dots 135 in the place of the silicon layer (115 of FIG. 3). Alternately, metal quantum dots may be formed of gold (Au) or aluminum (Al) instead of the silicon quantum dots 135.

Figure 4B:
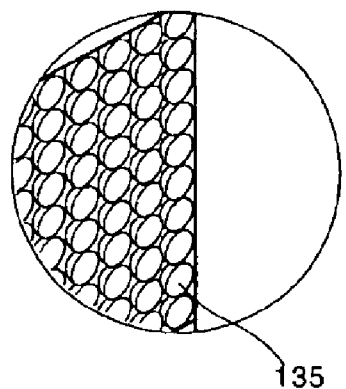
FIG. 4B illustrates an enlarged view of a circular portion 'A' of FIG. 4A.

FIG. 4B illustrates an enlarged view of a circular portion 'A' of FIG. 4A.

The silicon quantum dots 135 can be substituted by metal quantum dots. The silicon quantum dots 135 or the metal quantum dots can be formed by a physical or a chemical method.

Examples of the physical method of manufacturing the silicon quantum dots 135 or the metal quantum dots include a sputtering method, a vacuum synthesis method, a gas-phase synthesis method, a condensed phase synthesis method, a high deposition rate method using an ionized cluster beam, a consolidation method, a high-speed milling method, a mix-alloy processing method, a deposition method, and a sol-gel method. An example of the chemical method of manufacturing the silicon quantum dots 135 or the metal quantum dots includes a low-pressure chemical vapor deposition (LPCVD) method.

Referring back to FIG. 4A, in order to fabricate the SONSNOS memory according to the second embodiment of the present invention, ions are lightly implanted into the substrate 121 to form a channel region (not shown). After the first oxide layer 131a and the first nitride layer 133a are deposited, the silicon quantum dots 135 are formed on the first nitride layer 133a using a physical or chemical method. Thereafter, the second nitride layer 133b, the second oxide layer 131b, and a semiconductor layer for forming the gate electrode 127 are deposited on the silicon quantum dots 135, and the layers are patterned and etched as shown in FIG. 4A. Ions are heavily implanted using the semiconductor layer for the gate electrode 127 as a mask to form the source and drain electrodes 123 and 125. Accordingly, the source and drain electrodes 123 and 125 and the gate electrode 127 are formed.

The reading, recording, and erasing operations of the SONSNOS memory cell according to the second embodiment of the present invention are the same as those of the SONSNOS memory cell according to the first embodiment of the present invention. However, the SONSNOS memory cell of the second embodiment of the present invention as compared to that of the first embodiment has a higher memory capacity due to a larger number of electron trap sites in the silicon quantum dots 135 or the metal quantum dots than in the silicon layer 115.

SONSNOS memory cells according to a third embodiment and a fourth embodiment of the present invention are formed by multi-layered nitride/silicon/nitride/silicon/nitride (NSNSN) structures instead of single-layered nitride/silicon/nitride (NSN) structures in the SONSNOS memory cells of the first and second embodiments of the present invention. Thus, in the multi-layered structure, the nitride and silicon layers are repeated, thereby increasing the memory capacity of the multi-layered structure.

Figure 5:
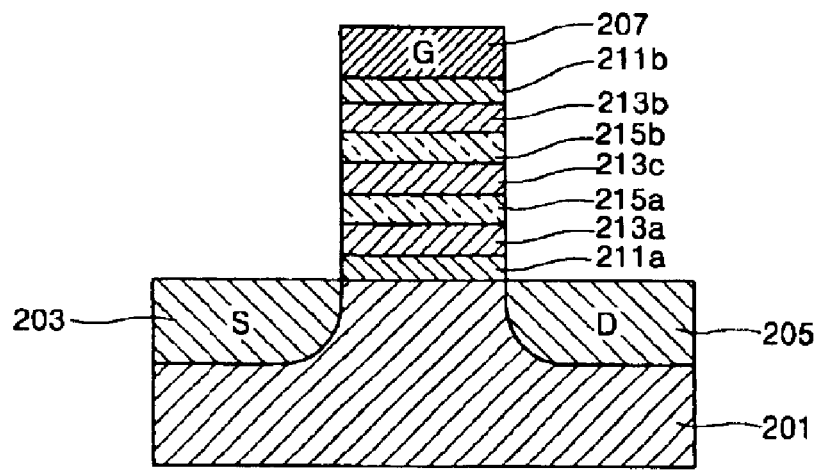
FIG. 5 illustrates a sectional view of a multi-layered SONSNOS memory cell according to a third embodiment of the present invention.

FIG. 5 illustrates a sectional view of a multi-layered SONSNOS memory cell according to the third embodiment of the present invention.

Referring to FIG. 5, an oxide/nitride/silicon/nitride/silicon/nitride/oxide (ONSNSNO) layer is interposed between a substrate 201 and a gate electrode 207. A source electrode 203 and a drain electrode 205 are formed in the substrate 201. The ONSNSNO layer includes first and second oxide layers 211a and 211b, located on the substrate 201 and under the gate electrode 207, respectively; first and second nitride layers 213a and 213b, arranged on the first oxide layer 211a and under the second oxide layer 211b, respectively; first and second silicon layers 215a and 215b, formed on the first nitride layer 213a and under the second nitride layer 213b, respectively; and a third nitride layer 213c interposed between the first and second silicon layers 215a and 215b.

Figure 6:
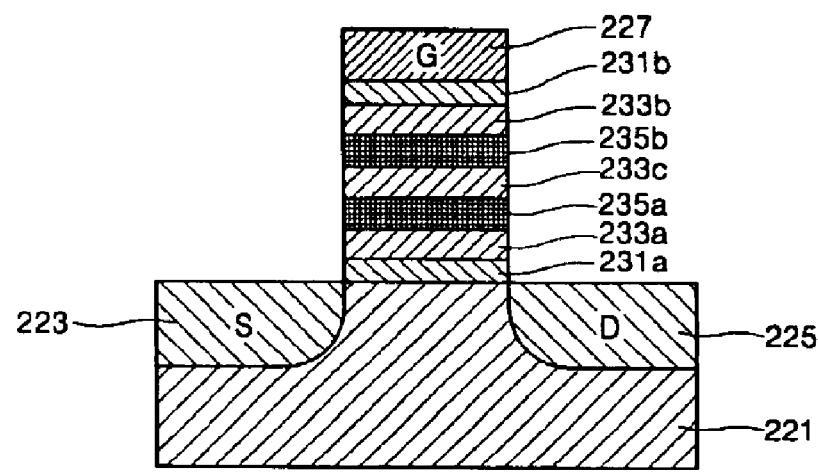
FIG. 6 illustrates a sectional view of a multi-layered SONSNOS memory cell according to a fourth embodiment of the present invention.

FIG. 6 illustrates a sectional view of a multi-layered SONSNOS memory cell according to the fourth embodiment of the present invention.

Referring to FIG. 6, the multi-layered SONSNOS memory according to the fourth embodiment of the present invention has a structure similar to the structure of the multi-layered SONSNOS memory according to the third embodiment of the present invention, except for the inclusion of the first and second silicon quantum dots 235a and 235b in the place of the first and second silicon layers (215a and 215b of FIG. 5). Here, first and second metal quantum dots can be formed instead of the first and second silicon quantum dots 235a and 235b. The metal quantum dots may be formed of Au or Al. Layers referenced by numerals 231a, 231b, 233a, 233b, 233c and 227 in FIG. 6 are similar to the layers 211a, 211b, 213a, 213b, 213c and 207 in FIG. 5, respectively. Reference numeral 221 denotes a substrate.

According to the third and fourth embodiments of the present invention, the materials used for the oxide layers, nitride layers and gate electrode may be the same as those used for the respective layers in the first and second embodiments of the present invention.

The multi-layered SONSNOS memory cells according to the third and fourth embodiments of the present invention shown in FIGS. 5 and 6 have multi-layered trap sites storing electrons to increase the memory storage capacity in comparison to the SONSNOS memories according to the first and second embodiments of the present invention shown in FIGS. 3 and 4A. According to the third and the fourth embodiments of the present invention, the number of alternating nitride layers and silicon layers (or silicon quantum dots) formed between the first and the second oxide layers may be greater than what is actually shown in FIGS. 5 and 6.

Figure 7:
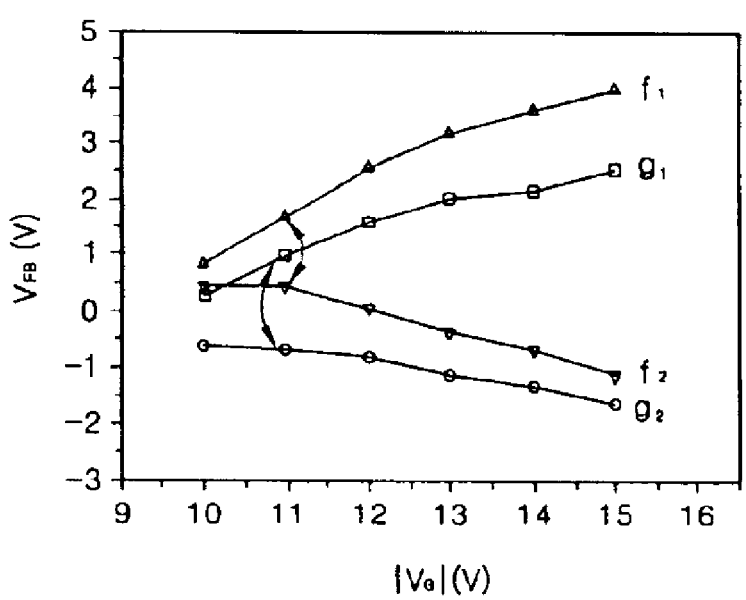
FIG. 7 is a graph showing changes in flat band voltages in a multi-layered SONSNOS memory cell according to the first embodiment of the present invention and in a conventional SONOS memory cell, in response to changes in gate voltages for recording and erasing information in the memory cells.

FIG. 7 is a graph showing changes in flat band voltages of the conventional SONOS memory cell and the SONSNOS memory cell according to the first embodiment of the present invention in response to the changes in gate voltages for recording and erasing information in the memory cells.

Referring to FIG. 7, the graph $f_1$ illustrates the changes in the flat band voltage $V_{FB}$ in response to the changes in the gate voltage for recording information in the conventional SONOS memory. The graph $f_2$ illustrates the changes in the flat band voltage $V_{FB}$ in response to the changes in the gate voltage for erasing the conventional SONOS memory cell. The graph $g_1$ illustrates the changes in the flat band voltage $V_{FB}$ in response to the changes in the gate voltage for recording information in the SONSNOS memory cell. The graph $g_2$ illustrates the changes in the flat band voltage $V_{FB}$ in response to the changes in the gate voltage for erasing the SONSNOS memory cell. At gate voltages $V_G$ under 12 V, the difference between the flat band voltage $V_{FB}$ of the graph $f_1$ and the flat band voltage $V_{FB}$ of the graph $f_2$ is smaller than the difference between the flat band voltage $V_{FB}$ of the graph $g_1$ and the flat band voltage $V_{FB}$ of the graph $g_2$. Accordingly, it may be seen that the performance of the SONSNOS memory according to the first embodiment of the present invention is superior to that of the conventional SONOS memory.

The SONSNOS memory according to the present invention forms multi-nitride layers and multi-silicon layers and has the structure using silicon quantum dots or metal quantum dots to increase the number of trap sites for storing electrons. Accordingly, the SONSNOS memory can be programmed at a high rate while having an improved information recording capacity.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, nano-sized particles for forming nano-sized quantum dots can be prepared by various methods that can be used in a single electron transistor.

What is claimed is:

1. A silicon/oxide/nitride/silicon/nitride/oxide/silicon (SONSNOS) structure memory device having a semiconductor substrate including a source electrode and a drain electrode that are separated by a predetermined distance and a channel for moving electrons between the source and drain electrodes, and a gate electrode formed on the semiconductor substrate to control the input of the electrons from the channel into traps of the SONSNOS structure, the SONSNOS structure comprising:

a first insulating layer and a second insulating layer stacked on the channel of the substrate;

a first dielectric layer and a second dielectric layer formed on the first insulating layer and under the second insulating layer, respectively; and a group IV semiconductor layer interposed between the first dielectric layer and the second dielectric layer.

2. The SONSNOS structure memory device as claimed in claim 1, wherein each of the first insulating layer and the second insulating layer is formed of a material selected from the group consisting of silicon oxide ($SiO_2$), aluminum oxide ($Al_2O_3$), tantalum oxide ($TaO_2$), and titanium oxide ($TiO_2$).

3. The SONSNOS structure memory device as claimed in claim 1, wherein each of the first dielectric layer and second dielectric layer is formed of one of silicon nitride ($Si_3N_4$) and PZT.

4. The SONSNOS structure memory device as claimed in claim 1, wherein the group IV semiconductor layer is formed of one of silicon (Si) and germanium (Ge).

5. A silicon/oxide/nitride/silicon/nitride/oxide/silicon (SONSNOS) structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure comprising:

a first insulating layer and a second insulating layer stacked on the channel of the substrate;

a first dielectric layer and a second dielectric layer formed on the first insulating layer and under the second insulating layer, respectively; and nano quantum dots that are formed of a group IV semiconductor material interposed between the first and the second dielectric layers.

6. The SONSNOS structure memory device as claimed in claim 5, wherein each of the first insulating layer and the second insulating layer is formed of a material selected from the group consisting of silicon oxide ($SiO_2$), aluminum oxide ($Al_2O_3$), tantalum oxide ($TaO_2$), and titanium oxide ($TiO_2$).

7. The SONSNOS structure memory device as claimed in claim 5, wherein each of the first dielectric layer and the second dielectric layer is formed of one of silicon nitride ($Si_3N_4$) and PZT.

8. The SONSNOS structure memory device as claimed in claim 5, wherein the group IV semiconductor material is one of silicon (Si) and germanium (Ge).

9. The SONSNOS structure memory device as claimed in claim 5, wherein the nano quantum dots are formed by one of a low pressure chemical vapor deposition (LPCVD) method and a physical method.

10. The SONSNOS structure memory device as claimed in claim 9, wherein the physical method is selected from the group consisting of a sputtering method, a vacuum synthesis method, a gas-phase synthesis method, a condensed phase synthesis method, a high deposition rate method using an ionized cluster beam, a consolidation method, a high-speed milling method, a mix-alloy processing method, a deposition method, and a sol-gel method.

11. A silicon/oxide/nitride/silicon/nitride/oxide/silicon (SONSNOS) structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure comprising:

a first insulating layer and a second insulating layer stacked on the channel of the substrate;

a first dielectric layer and a second dielectric layer formed on the first insulating layer and under the second insulating layer, respectively; and nano quantum dots that are formed of a metal and are interposed between the first and the second dielectric layers.

12. The SONSNOS structure memory device as claimed in claim 11, wherein each of the first insulating layer and the second insulating layer is formed of a material selected from the group consisting of silicon oxide ($SiO_2$), aluminum oxide ($Al_2O_3$), tantalum oxide ($TaO_2$), and titanium oxide ($TiO_2$).

13. The SONSNOS structure memory device as claimed in claim 11, wherein each of the first dielectric layer and the second dielectric layer is formed of one of silicon nitride ($Si_3N_4$) and PZT.

14. The SONSNOS structure memory device as claimed in claim 11, wherein the metal is one of gold (Au) and aluminum (Al).

15. The SONSNOS structure memory device as claimed in claim 11, wherein the nano quantum dots are formed by one of a low pressure chemical vapor deposition (LPCVD) method and a physical method.

16. The SONSNOS structure memory device as claimed in claim 15, wherein the physical method is selected from the group consisting of a sputtering method, a vacuum synthesis method, a gas-phase synthesis method, a condensed phase synthesis method, a high deposition rate method using an ionized cluster beam, a consolidation method, a high-speed milling method, a mix-alloy processing method, a deposition method, and a sol-gel method.

17. A multi-layered silicon/oxide/nitride/silicon/nitride/oxide/silicon (SONSNOS) structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure comprising:

a first insulating layer and a second insulating layer stacked on the channel of the substrate;

a plurality of dielectric layers formed on the first insulating layer and under the second insulating layer; and a plurality of group IV semiconductor layers, wherein one of the plurality of group IV semiconductor layers is interposed between adjacent dielectric layers.

18. The multi-layered SONSNOS structure memory device as claimed in claim 17, wherein each of the first insulating layer and the second insulating layer is formed of a material selected from the group consisting of silicon oxide ($SiO_2$), aluminum oxide ($Al_2O_3$), tantalum oxide ($TaO_2$), and titanium oxide ($TiO_2$).

19. The multi-layered SONSNOS structure memory device as claimed in claim 17, wherein each of the plurality of dielectric layers is formed of one of silicon nitride ($Si_3N_4$) and PZT.

20. The multi-layered SONSNOS structure memory device as claimed in claim 15, wherein each of the plurality of group IV semiconductor layer is formed of one of silicon (Si) and germanium (Ge).

21. A multi-layered silicon/oxide/nitride/silicon/nitride/oxide/silicon (SONSNOS) structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure comprising:

a first insulating layer and a second insulating layer stacked on the channel of the substrate;

a plurality of dielectric layers formed on the first insulating layer and under the second insulating layer; and nano quantum dots formed of a group IV semiconductor material interposed between adjacent dielectric layers.

22. The multi-layered SONSNOS structure memory device as claimed in claim 21, wherein each of the first insulating layer and the second insulating layer are formed of a material selected from the group consisting of silicon oxide ($SiO_2$), aluminum oxide ($Al_2O_3$), tantalum oxide ($TaO_2$), and titanium oxide ($TiO_2$).

23. The multi-layered SONSNOS structure memory device as claimed in claim 21, wherein each of the plurality of dielectric layers is formed of one of silicon nitride ($Si_3N_4$) and PZT.

24. The multi-layered SONSNOS structure memory device as claimed in claim 21, wherein the group IV semiconductor material is one of silicon (Si) and germanium (Ge).

25. The multi-layered SONSNOS structure memory device as claimed in claim 21, wherein the metal is one of gold (Au) and aluminum (Al).

26. The multi-layered SONSNOS structure memory device as claimed in claim 21, wherein the nano quantum dots are formed by one of a low pressure chemical vapor deposition (LPCVD) method and a physical method.

27. The multi-layered SONSNOS structure memory device as claimed in claim 26, wherein the physical method is selected from the group consisting of a sputtering method, a vacuum synthesis method, a gas-phase synthesis method, a condensed phase synthesis method, a high deposition rate method using an ionized cluster beam, a consolidation method, a high-speed milling method, a mix-alloy processing method, a deposition method, and a sol-gel method.

28. A multi-layered silicon/oxide/nitride/silicon/nitride/oxide/silicon (SONSNOS) structure memory device having a semiconductor substrate including a source electrode and a drain electrode that are separated by a predetermined distance and a channel for moving electrons between the source and the drain electrodes, and a gate electrode formed on the semiconductor substrate to control the input of the electrons from the channel into traps of the SONSNOS structure, the SONSNOS structure comprising:

a first insulating layer and a second insulating layer stacked on the channel of the substrate;

a plurality of dielectric layers formed on the first insulating layer and under the second insulating layer; and nano quantum dots formed of a metal interposed between adjacent dielectric layers.

29. The multi-layered SONSNOS structure memory device as claimed in claim 28, wherein each of the first insulating layer and the second insulating layer is formed of a material selected from the group consisting of silicon oxide ($SiO_2$), aluminum oxide ($Al_2O_3$), tantalum oxide ($TaO_2$), and titanium oxide ($TiO_2$).

30. The multi-layered SONSNOS structure memory device as claimed in claim 28, wherein each of the plurality of dielectric layers is formed of one of silicon nitride ($Si_3N_4$) and PZT.

31. The multi-layered SONSNOS structure memory device as claimed in claim 28, wherein the nano quantum dots are formed by one of a low pressure chemical vapor deposition (LPCVD) method and a physical method.

32. The multi-layered SONSNOS structure memory device as claimed in claim 31, wherein the physical method is selected from the group consisting of a sputtering method, a vacuum synthesis method, a gas-phase synthesis method, a condensed phase synthesis method, a high deposition rate method using an ionized cluster beam, a consolidation method, a high-speed milling method, a mix-alloy processing method, a deposition method, and a sol-gel method.

* * * * *